United States Patent
Ogiwara et al.

(10) Patent No.: US 7,142,473 B2
(45) Date of Patent: Nov. 28, 2006

(54) SEMICONDUCTOR DEVICE HAVING SEMICONDUCTOR MEMORY WITH SENSE AMPLIFIER

(75) Inventors: Ryu Ogiwara, Yokohama (JP); Daisaburo Takashima, Yokohama (JP); Michael Jacob, Yokohama (JP)

(73) Assignees: Kabushiki Kaisha Toshiba, Tokyo (JP); Infineon Technologies, AG, Munich (DE)

( * ) Notice: Subject to any disclaimer, the term of this patent is extended or adjusted under 35 U.S.C. 154(b) by 0 days.

(21) Appl. No.: 11/059,569

(22) Filed: Feb. 17, 2005

(65) Prior Publication Data

US 2005/0146918 A1 Jul. 7, 2005

Related U.S. Application Data

(62) Division of application No. 10/291,610, filed on Nov. 12, 2002, now Pat. No. 6,898,104.

(51) Int. Cl.
G11C 7/04 (2006.01)

(52) U.S. Cl. .................. 365/211; 365/145; 365/189.09

(58) Field of Classification Search ................ 365/145, 365/189.9, 211, 189.09
See application file for complete search history.

(56) References Cited

U.S. PATENT DOCUMENTS

| | | | |
|---|---|---|---|
| 5,237,533 A | | 8/1993 | Papaliolios |
| 5,424,975 A | | 6/1995 | Lowrey et al. |
| 5,847,989 A | | 12/1998 | Seyyedy |
| 5,903,492 A | * | 5/1999 | Takashima .................. 365/145 |
| 6,198,652 B1 | | 3/2001 | Kawakubo et al. |
| 6,392,918 B1 | | 5/2002 | Braun et al. |
| 6,487,104 B1 | * | 11/2002 | Takashima .................. 365/145 |
| 6,493,251 B1 | * | 12/2002 | Hoya et al. .................. 365/145 |
| 6,566,698 B1 | * | 5/2003 | Nishihara et al. ........... 257/295 |
| 6,819,601 B1 | * | 11/2004 | Eliason et al. ......... 365/189.09 |
| 2003/0227809 A1 | | 12/2003 | Schwartz |

\* cited by examiner

Primary Examiner—Hoai V. Ho
(74) Attorney, Agent, or Firm—Oblon, Spivak, McClelland, Maier & Neustadt, P.C.

(57) ABSTRACT

A semiconductor device comprises a memory cell array, bit line, /bit line complementary to the bit line, reference voltage generating circuit and sense amplifier. The bit line is connected to the memory cells and applied with a voltage read from each memory cell of the memory cell array. The /bit line is supplied with a reference voltage. The reference voltage generating circuit generates the reference voltage that has temperature dependence for compensating a change in the voltage, read to the bit line, due to temperature. The reference voltage generating circuit controls the reference voltage such that the reference voltage assumes a midpoint of trails of a signal value distribution indicative of "0" data and a signal value distribution indicative of "1" data. The sense amplifier compares the voltage, read to the bit line, with the reference voltage supplied to the /bit line, and amplifies the difference therebetween.

9 Claims, 10 Drawing Sheets

SEMICONDUCTOR DEVICE HAVING SEMICONDUCTOR MEMORY WITH SENSE AMPLIFIER

CROSS-REFERENCE TO RELATED APPLICATIONS

This application is a divisional of U.S. application Ser. No. 10/291,610, filed Nov. 12, 2002 now U.S. Pat. No. 6,898,104; the entire contents of which are incorporated herein by reference.

BACKGROUND OF THE INVENTION

1. Field of the Invention

The present invention relates to a semiconductor device, and more particularly to a reference voltage generating circuit for, for example, a sense amplifier incorporated in a semiconductor memory using a ferroelectric capacitor.

2. Description of the Related Art

In the prior art, it is considered that the peak-to-peak midpoint of the signal value distributions obtained when data "0" and "1" have been read at a low temperature is identical to that of the signal value distributions obtained when data "0" and "1" have been read at a high temperature, and therefore that it is not necessary to make a reference voltage for a sense amplifier depend on temperature (the signal value distribution(s) obtained when data "0" and/or "1" has been read will be hereinafter referred to as "0" and/or "1" signal distribution). In other words, a predetermined reference voltage is used for the voltage read from each memory cell to a corresponding bit line.

However, the "1" signal distribution at a low temperature has a tail, whereas the "1" signal distribution at a high temperature dose not have a long tail. Therefore, at a high temperature, the midpoint of the window defined between the tails of the "0" "1" signal distributions has a high value. This fact is passed unnoticed in the prior art.

BRIEF SUMMARY OF THE INVENTION

According to an aspect of the invention, there is provided a semiconductor device comprising: a memory cell array having a plurality of memory cells; a bit line connected to the memory cells and applied with a voltage read from each of the memory cells; a second bit line complementary to the bit line, the second bit line being supplied with a reference voltage; a reference voltage generating circuit which generates the reference voltage, the reference voltage having temperature dependence which compensates a change in the voltage, read to the bit line, due to temperature; and a sense amplifier which compares the voltage, read to the bit line, with the reference voltage supplied to the second bit line, and amplifies the difference between the voltage and the reference voltage, wherein the reference voltage generating circuit controls the reference voltage of the sense amplifier such that the reference voltage assumes a midpoint of trails of a signal value distribution indicative of "0" data and a signal value distribution indicative of "1" data.

DETAILED DESCRIPTION OF THE INVENTION

Figure 1:
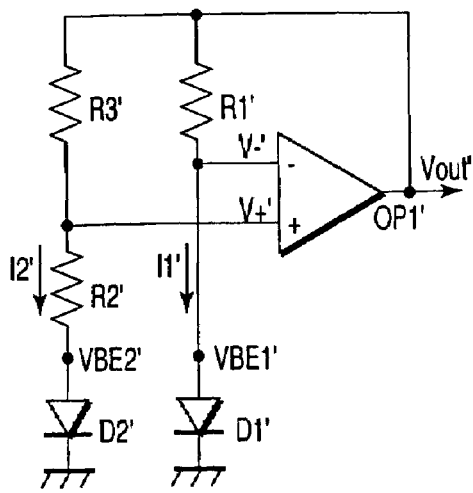
FIG. 1 is a circuit diagram illustrating a voltage generating circuit according to a first embodiment of the invention.

Reference will now be made in detail to embodiments of the invention as illustrated in the accompanying drawings, in which like reference characters designate like or corresponding parts throughout the several drawings.

[First Embodiment]

Referring first to FIGS. 1–7, a semiconductor device according to a first embodiment of the invention will be described.

Figure 6:
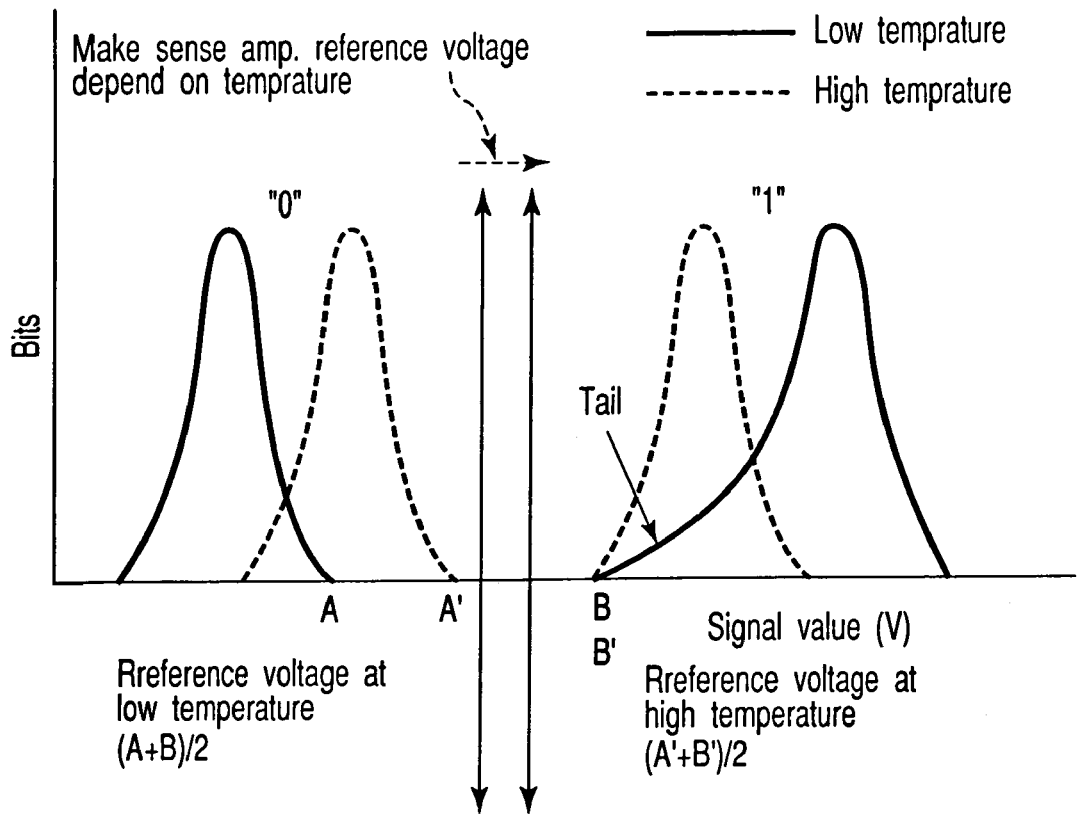
FIG. 6 is a graph showing "0" "1" signal distributions at low and high temperatures.

FIG. 6 shows the "0" "1" signal distributions obtained at low and high temperatures. As shown, the peak-to-peak midpoint of the "0" "1" signal distributions at the low temperature is identical to that of the "0" "1" signal distributions at the high temperature. However, the "1" signal distribution at the low temperature has a tail, whereas the "1" signal distribution at the high temperature has no tail. Therefore, at the high temperature, the midpoint of the window defined between the tails of the "0" "1" signal distributions has a high value.

Figure 7:
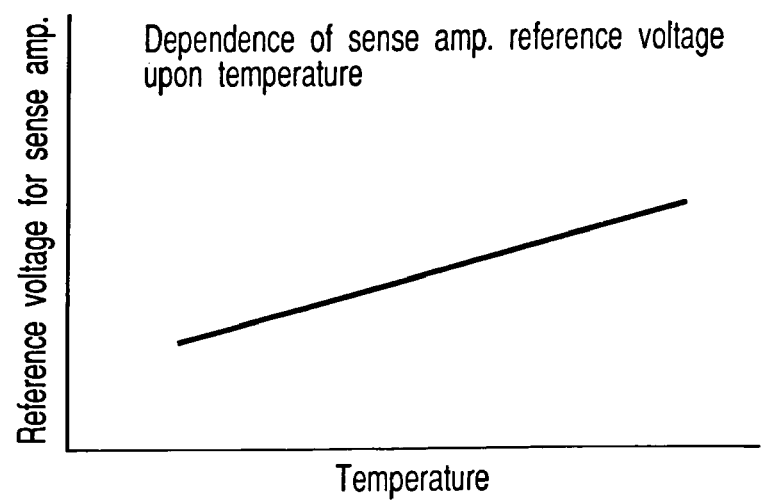
FIG. 7 is a graph showing the dependence, upon temperature, of the reference voltage for the sense amplifier used to make the midpoint of a window constant independent of temperature.

Further, FIG. 7 shows a case where a reference voltage for a sense amplifier incorporated in the semiconductor device is made to depend on temperature so that it is always identical to the midpoint of the window, regardless of temperature. The reference voltage supplied to the sense amplifier in accordance with the voltage read from a memory cell to a bit line is designed such that the higher the temperature, the higher the reference voltage, as shown in FIG. 7. On the other hand, the reference voltages supplied to other sense amplifiers such as one for the DQ line are kept constant independent of temperature, as in the prior art. This structure permits a bit-line comparison/amplification circuit and other circuits to secure a sufficient operation margin irrespective of temperature.

FIG. 1 shows a voltage generating circuit according to the first embodiment of the invention. This circuit comprises an operational amplifier OP1', diodes D1' and D2' and resistors R1', R2' and R3'. These elements are connected as follows. The positive input terminal (+) of the operational amplifier OP1' is connected to the ground potential via the resistor R2' and diode D2' connected in series, and is also connected to the output terminal of the operational amplifier OP1' via the resistor R3'. Further, the negative input terminal (−) of the operational amplifier OP1' is connected to the ground potential via the diode D1', and is also connected via the resistor R1' to the junction of the output terminal of the operational amplifier OP1' and the resistor R3'. When reading data, the voltage generating circuit generates a base voltage Vout' for generating a reference voltage for the sense amplifier. The base voltage Vout' has a temperature dependence characteristic and hence increases as the temperature increases.

Figure 2:
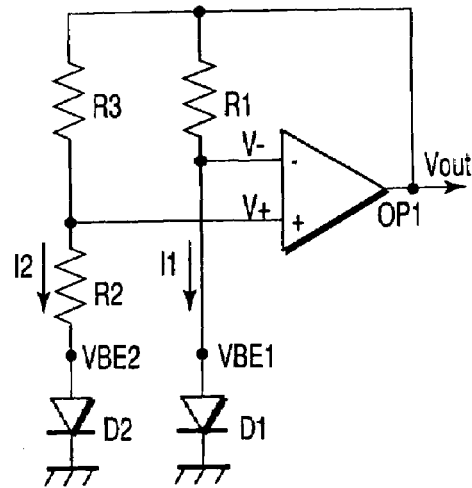
FIG. 2 is a circuit diagram illustrating a conventional voltage generating circuit that does not have a temperature dependence characteristic.

FIG. 2 is a circuit diagram illustrating a voltage generating circuit for generating a base voltage unaffected by temperature. This circuit comprises an operational amplifier OP1, diodes D1 and D2 and resistors R1, R2 and R3, and generates a base voltage Vout unaffected by temperature.

Figure 3A:
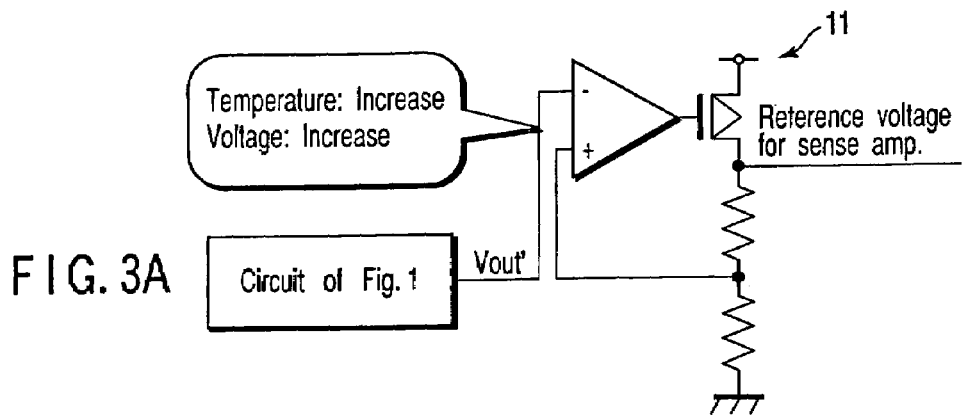
FIG. 3A is a circuit diagram illustrating a reference voltage generating circuit for generating a reference voltage for a sense amplifier dependent on temperature.
Figure 3B:
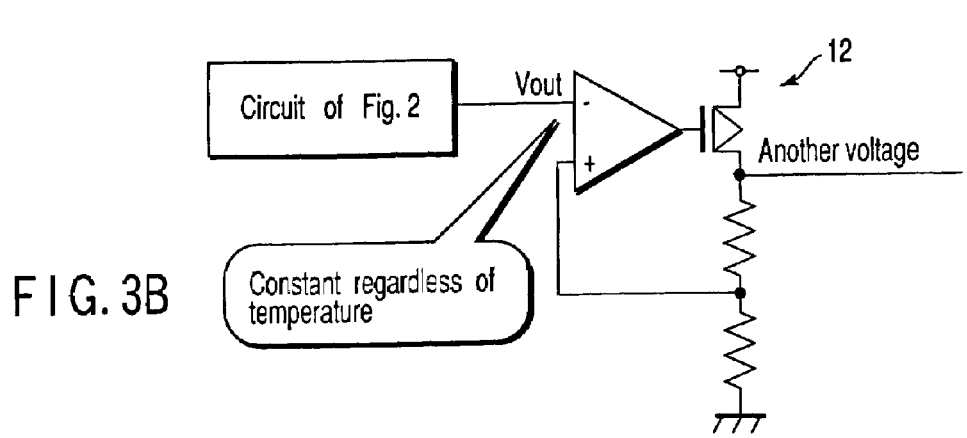
FIG. 3B is a circuit diagram illustrating a voltage generating circuit for generating a voltage independent of temperature.

The base voltages Vout' and Vout generated by the circuits of FIGS. 1 and 2 are input to the reference voltage generating circuit 11 shown in FIG. 3A, and the voltage generating circuit 12 shown in FIG. 3B, respectively. The reference voltage generating circuit 11 generates a reference voltage Vref for a bit line sense amplifier dependent on temperature. The voltage generating circuit 12 generates other voltages independent of temperature, such as a plate driving voltage supplied to a plate line, a reference voltage supplied to a DQ sense amplifier, etc.

Figure 4:
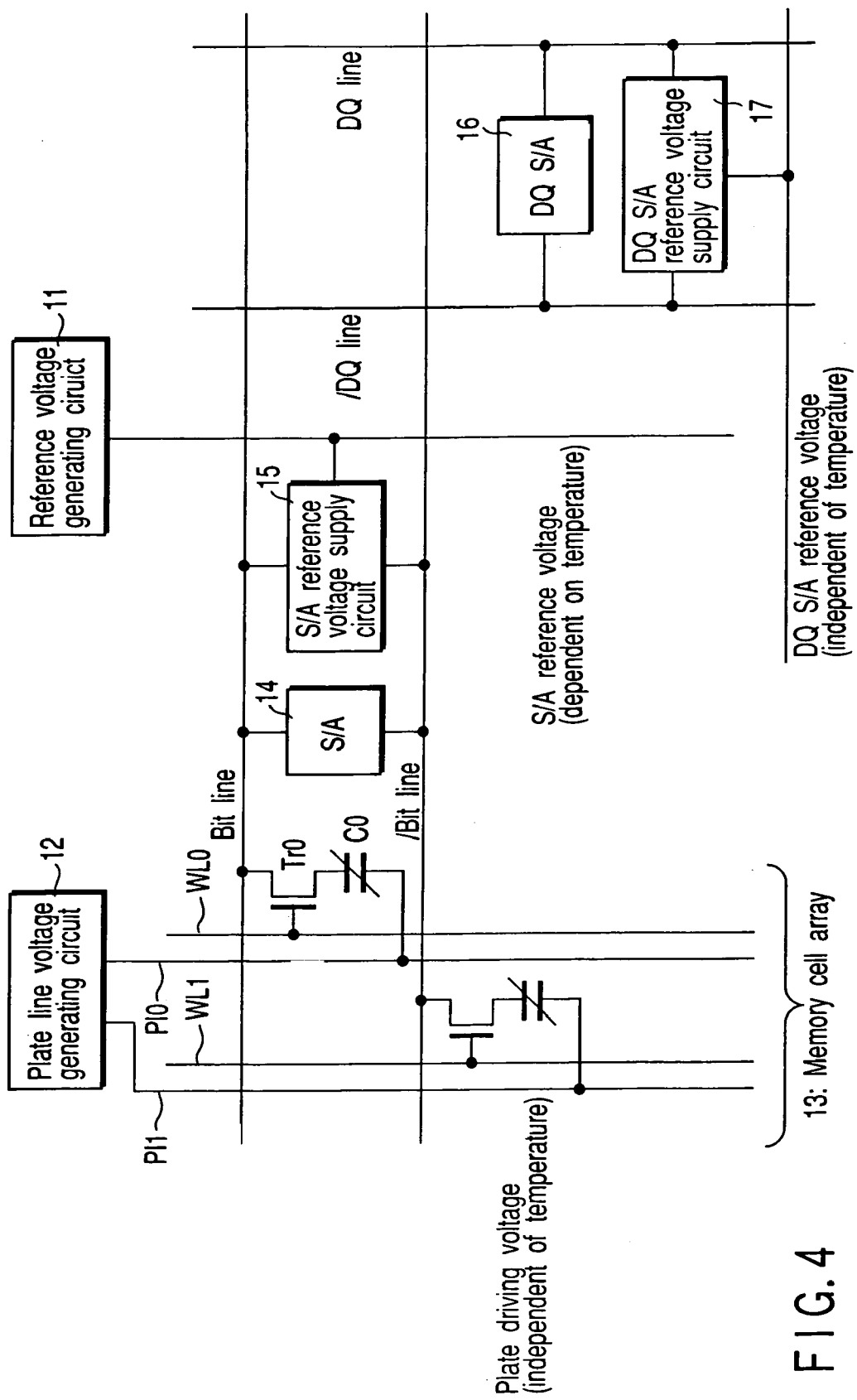
FIG. 4 is a concept diagram illustrating an essential part of a semiconductor memory according to a first embodiment of the invention, in which a ferroelectric capacitor is used as a memory element.

FIG. 4 is a concept diagram illustrating an essential part of the ferroelectric memory to which the reference voltage generating circuit 11 shown in FIG. 3A and the voltage generating circuit 12 shown in FIG. 3B supply voltages.

As seen from FIG. 4, the ferroelectric memory has a memory cell array 13 composed of a plurality of memory cells. In each memory cell, the electrodes of a ferroelectric capacitor C0 are connected to the source of a MOS transistor Tr0 and a plate line Pl0, respectively, the gate of the MOS transistor Tr0 is connected to a word line WL0, and the drain of the MOS transistor Tr0 is connected to a bit line. The ferroelectric memory further comprises a sense amplifier (S/A) 14, reference voltage supply circuit 15 for the sense amplifier, DQ sense amplifier (DQ S/A) 16, and reference voltage supply circuit 17 for the DQ sense amplifier, and the aforementioned reference voltage generating circuit 11 and plate line voltage generating circuit 12.

The sense amplifier 14 compares the voltage of the bit line with that of a complementary /bit line, thereby amplifying the comparison result, and the reference voltage generating circuit 11 generates a reference voltage dependent on temperature, which is supplied to the /bit line. The plate line voltage generating circuit 12 generates a plate driving voltage independent of temperature, which is supplied to plate lines Pl0 and Pl1. The DQ line sense amplifier 16 compares the voltage of the DQ line with that of a complementary /DQ line, and amplifies the comparison result.

A description will be given of a method for generating the base voltage Vout independent of temperature, using the combination of the resistors R1, R2 and R3 and operational amplifier OP1 as shown in FIG. 2. After that, a description will be given of a method for generating the base voltage Vout' dependent on temperature as shown in FIG. 7, using the structure shown in FIG. 1.

In FIG. 2, the diodes D1 and D2 have Area1 and Area2, respectively. In this case, the currents I1 and I2 flowing through the diodes D1 and D2 are given by $$I1 = Is \cdot \exp\{q \cdot VBE1/(k \cdot T)\} \quad (1)$$

$$I2 = Is \cdot \exp\{q \cdot VBE2/(k \cdot T)\} \quad (2)$$

If $R3 = R1 \cdot (Area1/Area2)$, the following equation (3), (4), (5) and (6) are obtained since V−=V+:

$$R1 \cdot I1 = R3 \cdot I2 \quad (3)$$

$$\ln(I1/I2) = \ln(Area1/Area2) = \{q/(k \cdot T)\} \cdot (VBE1 - VBE2) \quad (4)$$

$$Vout - VBE1 = I1 \cdot R1 \quad (5)$$

$$Vout - VBE2 = I2 \cdot (R2 + R3) \quad (6)$$

From (3) and (5), $$Vout - VBE1 = I2 \cdot R3 \quad (7)$$

Accordingly, the following equations are obtained:

$$I2 = (Vout - VBE1)/R3 \quad (8)$$

$$I2 = (Vout - VBE2)/(R2 + R3) \quad (9)$$

From (8) and (9), $$Vout = (R2 + R3)/R2 \cdot VBE1 - (R3/R2) \cdot VBE2 \quad (10)$$

From (3) and (10), $$Vout = \{(R2 + R3) \cdot VBE1 - R3 \cdot VBE2\}/R2 \quad (11)$$
$$= VBE1 + R3/R2 \cdot (k \cdot T/q) \cdot \ln(I1/I2)$$

Supposing here that the temperature dependence of VBE1, i.e., a voltage change per a unit temperature, is ΔVBE/ΔT, the condition for eliminating the temperature dependence is expressed by $$(R3/R2) \cdot (k/q) \cdot \ln(I1/I2) = -\Delta VBE/\Delta T \quad (12)$$

Further, k, q and ($\Delta$VBE/$\Delta$T) are given by (concerning $\Delta$VBE/$\Delta$T, a generally known value is used):

$$k = 1.38 \times 10^{-23} \, J/K \tag{13}$$

$$q = 1.602 \times 10^{-19} \, C \tag{14}$$

$$(\Delta VBE/\Delta T) \approx -2 \, mV/K \tag{15}$$

From the above equations, the following equation is extracted:

$$(R3/R2) \cdot \ln(I1/I2) = (R3/R2) \cdot \ln(Area1/Area2) \tag{16}$$
$$= (q/k) \cdot (-\Delta VBE/\Delta T)$$

Since $k=1.38 \times 10^{-23}$ J/K, $q=1.602 \times 10^{-19}$ C, and ($\Delta$VBE/$\Delta$T)$\approx$-2 mV/K, 23.2 is obtained from the formula (16).

From the above, the resistances R2 and R3 can be expressed using the resistance R1. The resistance R1 is determined on the basis of the maximum power consumption of the circuit.

$$R3 = (I1/I2) \cdot R1 = (Area1/Area2) \cdot R1 \, [ohm] \tag{17}$$

$$R2 = R3 \cdot \ln(Area1/Area2) / \{(q/k) \cdot (-\Delta VBE/\Delta T)\} \, [ohm] \tag{18}$$

A description will now be given of the method for making, using the structure shown in FIG. 1, the base voltage Vout' depend on temperature, in order to make the reference voltage Vref depend on temperature, as shown in FIG. 7.

Assuming that the temperature characteristic of the reference voltage Vref is R [mV/° C.], Vout' in FIG. 1 have a temperature characteristic of X [mV/° C.], given by the following equation:

$$X = R \cdot (Vout'/Vref) \, [mV/^\circ C.] \tag{19}$$

To impart the temperature characteristic of +X [mV/° C.] to Vout' in FIG. 1, the following equation must be satisfied:

$$(R3'/R2') \cdot (k/q) \cdot \ln(I1'/I2') = (-\Delta VBE/\Delta T + X)/1000 \tag{20}$$

Accordingly, the following equations are obtained:

$$(R3'/R2') \cdot \ln(I1'/I2') = (R3'/R2') \cdot \ln(Area1'/Area2') \tag{21}$$
$$= (q/k) \cdot (-\Delta VBE/\Delta T + X)/1000$$

where Area1' and Area2' represent the sizes of the diodes D1' and D2', respectively.

The following equations are finally obtained:

$$R3' = (I1'/I2') \cdot R1' = (Area1'/Area2') \cdot R1' \tag{22}$$

$$R2' = R3' \cdot k/q \cdot \ln(Area1'/Area2') / \{(X - \Delta VBE/\Delta T)/1000\} \tag{23}$$

By the above-described procedure, firstly, R3' is determined on the basis of the area ratio between the diodes D1' and D2', and then R2' is determined on the basis of a temperature coefficient extracted from FIG. 7. R1' is determined by the maximum power consumption of the circuit shown in FIG. 1.

As described above, in the first embodiment, a sufficient sense margin that is independent of temperature can be secured by imparting a temperature dependence characteristic to a reference voltage supplied to the sense amplifier.

Figure 5:
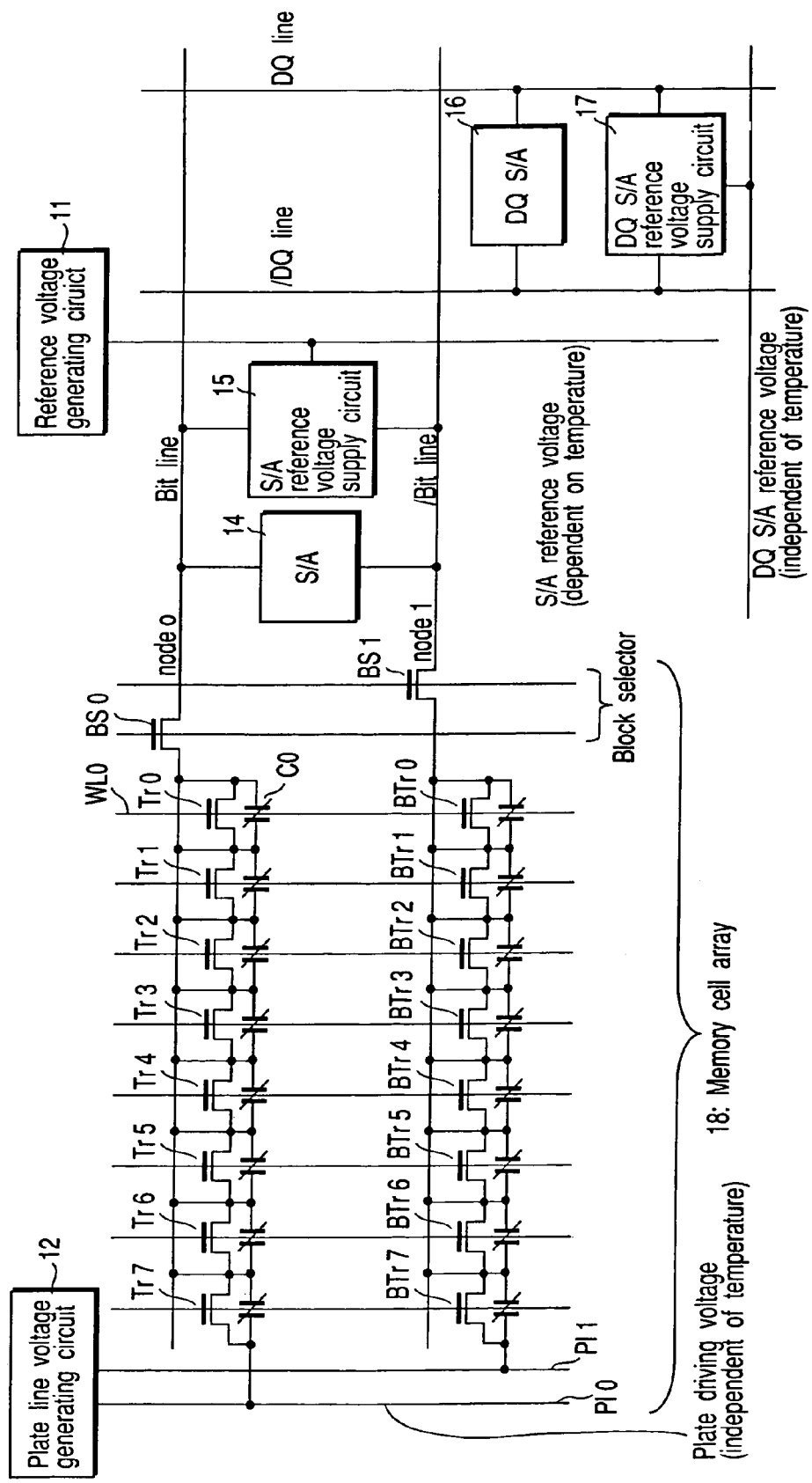
FIG. 5 is a concept diagram illustrating an essential part of a semiconductor memory according to a modification of the first embodiment.

Further, FIG. 5 is a concept diagram illustrating an essential part of a ferroelectric memory according to a modification of the first embodiment. This ferroelectric memory has the same structure as that of FIG. 4, except for a memory cell array 18. Therefore, a description will be given of only the memory cell array 18.

As shown in FIG. 5, in each memory cell, the opposite electrodes of a ferroelectric capacitor C0 are connected to the source and drain of a first MOS transistor Tr0, and the gate of the transistor Tr0 is connected to a word line WL0. A plurality of memory cells similar to this cell are connected in series. A plate line Pl0 is connected to one end of the thus connected memory cells, and a bit line is connected to the other end of the memory cells via a second MOS transistor BS0 for block selection, thereby forming a memory cell block. A plurality of memory cell blocks similar to this block are arranged to form the memory cell array 18.

The modification constructed as above can provide a sufficient sense margin that is unaffected by temperature, like the ferroelectric memory of FIG. 4.

[Second Embodiment]

Referring now to FIGS. 8–13 and 2, a semiconductor device according to a second embodiment of the invention will be described.

Figure 8:
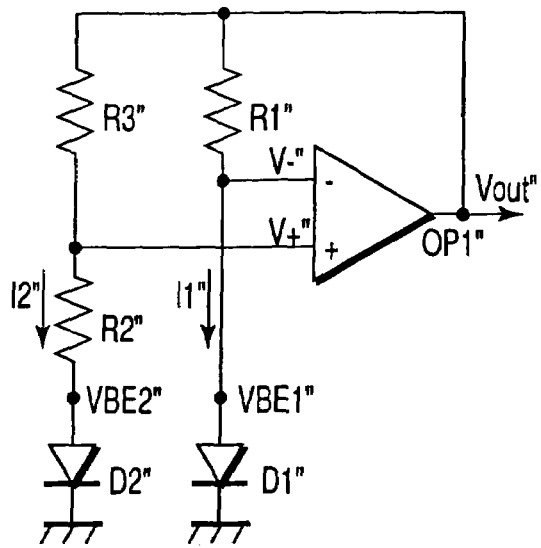
FIG. 8 is a circuit diagram illustrating a voltage generating circuit employed in a second embodiment of the invention for generating a voltage dependent on temperature, which is applied between the counter electrodes of a ferroelectric capacitor.

FIG. 8 shows a voltage generating circuit according to the second embodiment. This circuit comprises an operational amplifier OP1", diodes D1" and D2" and resistors R1", R2" and R3". These elements are connected as follows. The positive input terminal (+) of the operational amplifier OP1" is connected to the ground potential via the resistor R2" and diode D2" connected in series, and is also connected to the output terminal of the operational amplifier OP1" via the resistor R3". Further, the negative input terminal (-) of the operational amplifier OP1" is connected to the ground potential via the diode D1", and is also connected via the resistor R1" to the junction of the output terminal of the operational amplifier OP1" and the resistor R3". The voltage generating circuit imparts a temperature dependence characteristic to the voltage applied between the electrodes of a ferroelectric capacitor.

Figure 9A:
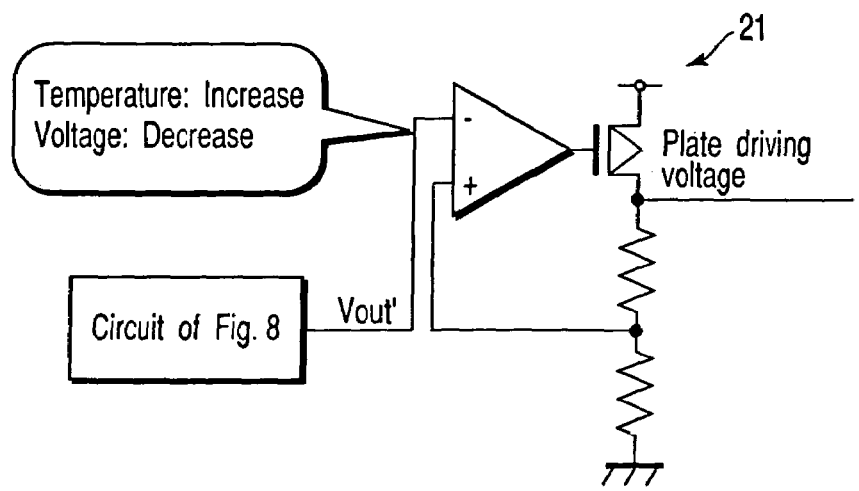
FIG. 9A is a circuit diagram illustrating a plate line voltage generating circuit for generating a plate driving voltage dependent on temperature.
Figure 9B:
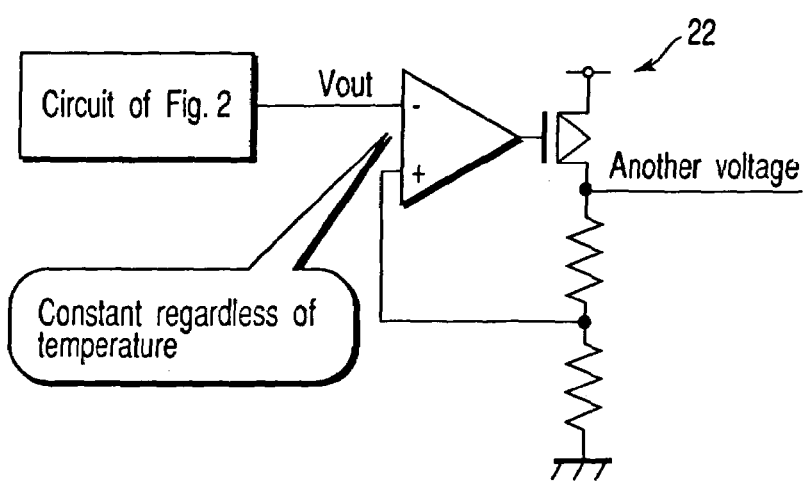
FIG. 9B is a circuit diagram illustrating a voltage generating circuit for generating a voltage independent of temperature.

The base voltages generated by the circuits of FIGS. 8 and 2 are respectively input to a plate line voltage generating circuit 21 shown in FIG. 9A and a voltage generating circuit 22 shown in FIG. 9B for generating another voltage. The plate line voltage generating circuit 21 generates a plate driving voltage Vpl dependent on temperature. The voltage generating circuit 22 generates another voltage independent of temperature.

Figure 10:
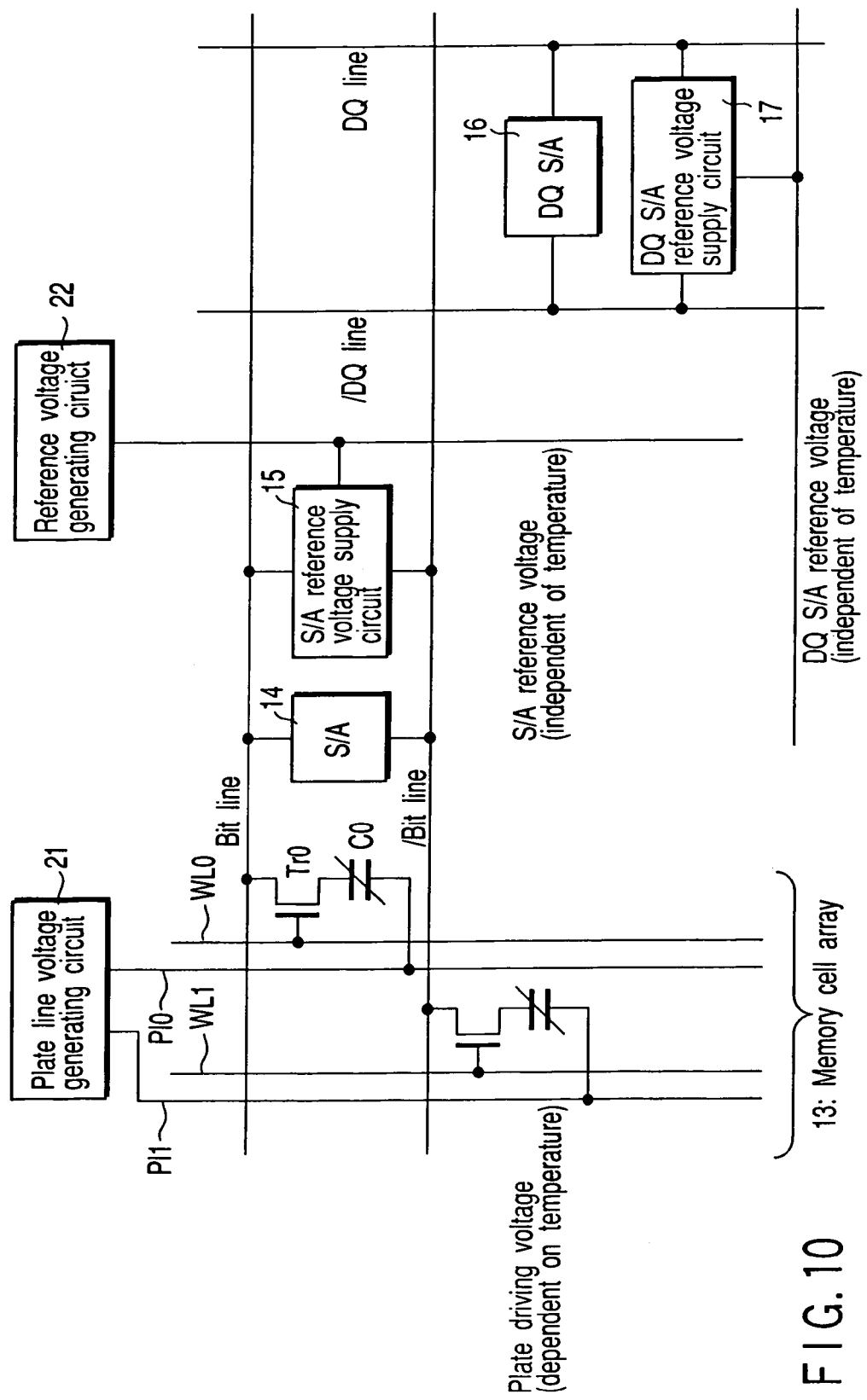
FIG. 10 is a concept diagram illustrating an essential part of a semiconductor memory according to the second embodiment.

FIG. 10 is a concept diagram illustrating an essential part of a ferroelectric memory according to the second embodiment, to which the plate line voltage generating circuit 21 shown in FIG. 9A and the voltage generating circuit 22 shown in FIG. 9B supply voltages. In this case, the voltage generating circuit 22 is a reference voltage generating circuit for generating a sense amplifier reference voltage.

The ferroelectric memory comprises the plate line voltage generating circuit 21 and the reference voltage generating circuit 22. The plate line voltage generating circuit 21 generates a plate driving voltage dependent on temperature, which is supplied to plate lines P10 and P11. The reference voltage generating circuit 22 generates a reference voltage independent of temperature, which is supplied to the /bit line. The other elements are similar to those of the ferroelectric memory shown in FIG. 4.

Figure 11:
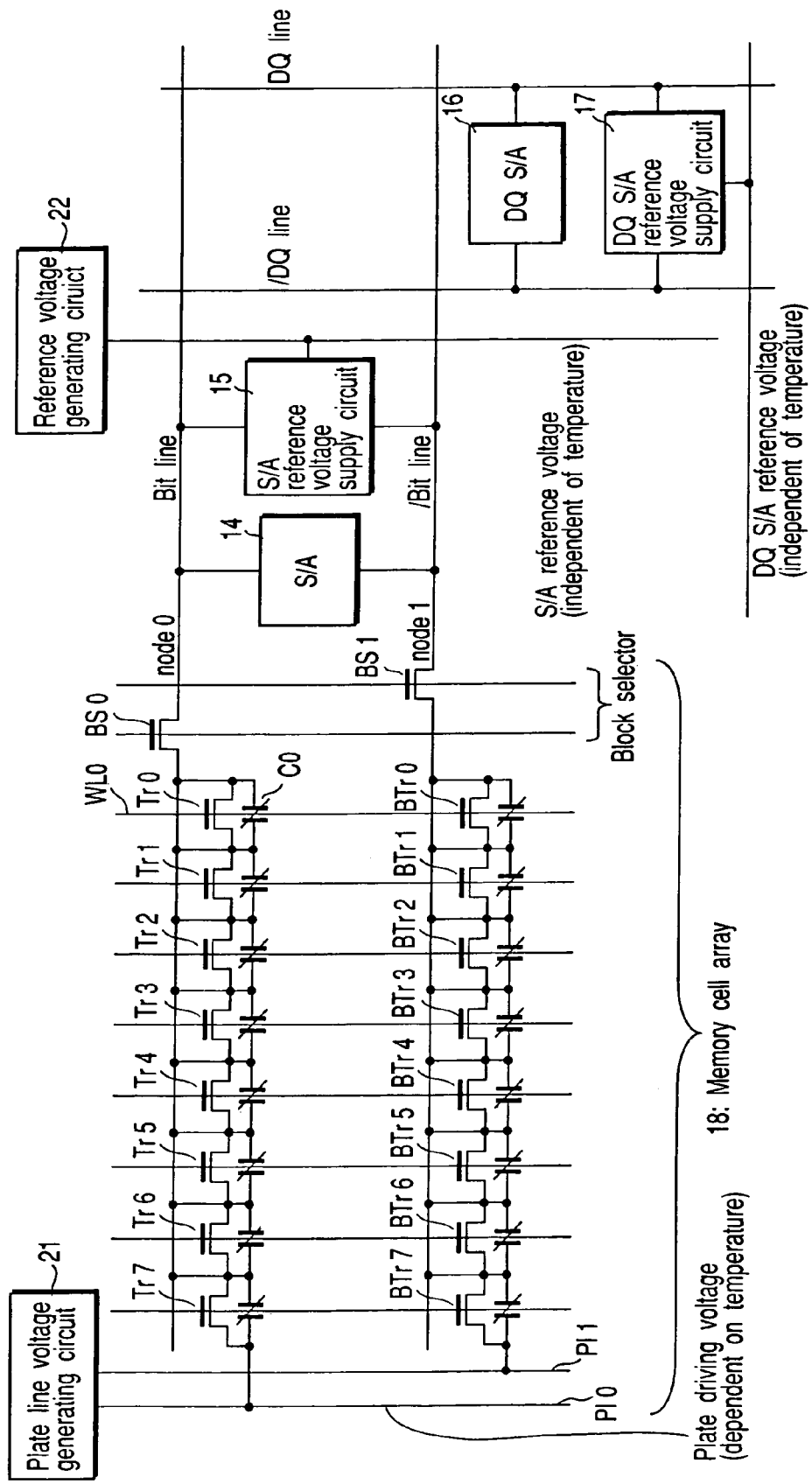
FIG. 11 is a concept diagram illustrating an essential part of a semiconductor memory according to a modification of the second embodiment.

FIG. 11 is a concept diagram illustrating an essential part of a ferroelectric memory according to a modification of the second embodiment.

This ferroelectric memory also includes the plate line voltage generating circuit 21 and the reference voltage generating circuit 22. The plate line voltage generating circuit 21 generates a plate driving voltage dependent on temperature, which is supplied to plate lines P10 and P11. The reference voltage generating circuit 22 generates a reference voltage independent of temperature, which is supplied to the /bit line. The elements except for a memory cell array 18 are similar to those of FIG. 10. The memory cell array 18 employed in this modification has a structure similar to that of the memory cell array 18 shown in FIG. 5.

Figure 12:
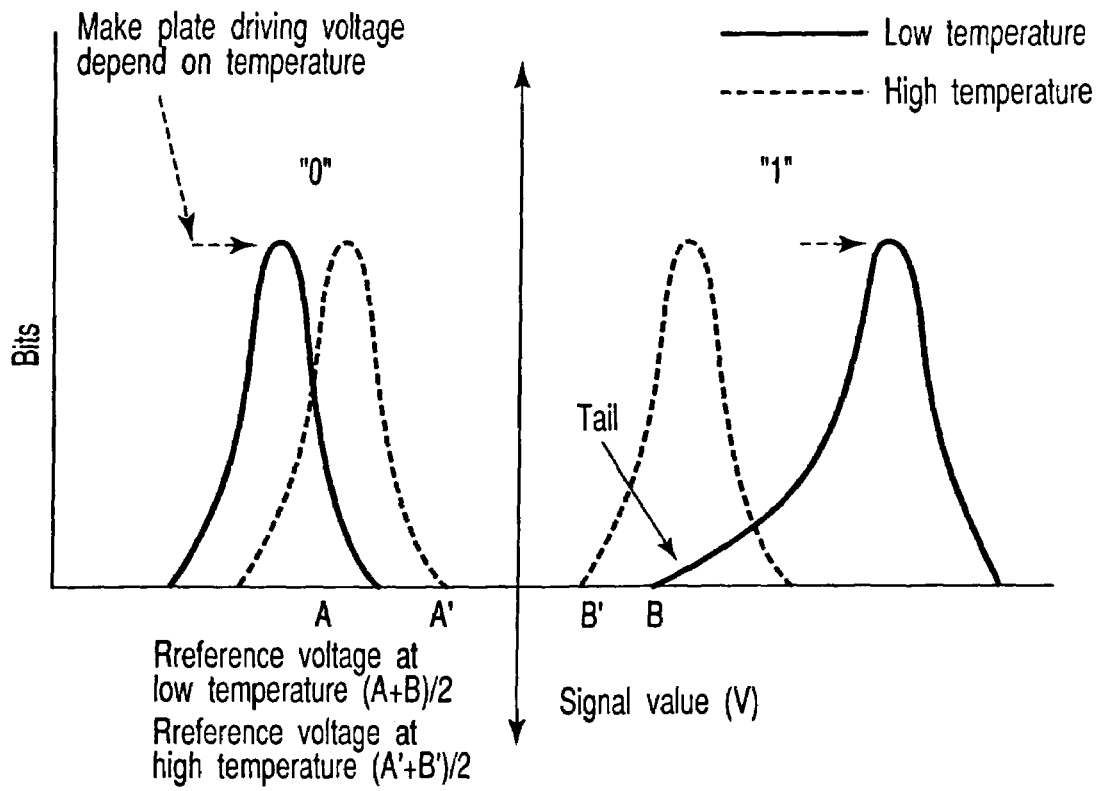
FIG. 12 is a graph illustrating a state in which the midpoints of the windows at high and low temperatures are made to coincide with each other by the circuit of FIG. 8.

FIG. 12 is a graph illustrating signal distributions in which the midpoints of the windows at high and low temperature are made to coincide with each other by the circuit of FIG. 8. In the ferroelectric memories of FIGS. 10 and 11, the midpoints of the windows of the "0" "1" signal distributions at high and low temperatures are made to coincide with each other, by virtue of a plate line voltage generating circuit that includes the circuit of FIG. 8.

Figure 13:
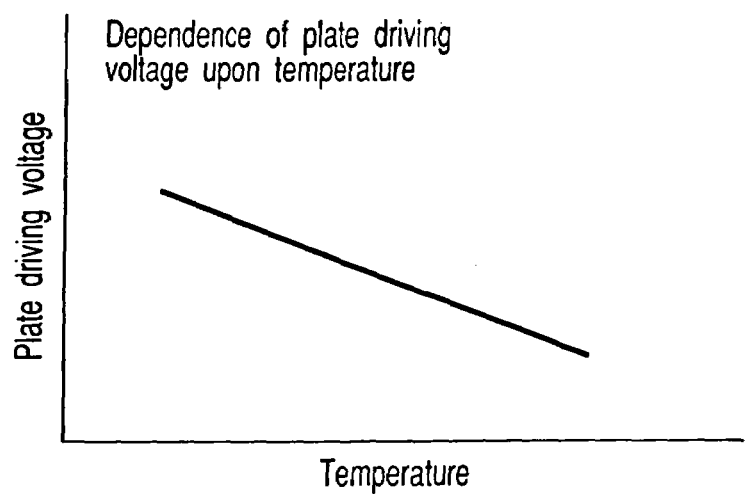
FIG. 13 is a graph showing the dependence, upon temperature, of a plate driving voltage for making the midpoint of a window constant independent of temperature.

In this modification, the plate driving voltage Vpl is designed to be affected by temperature, as shown in FIG. 13, instead of making the sense amplifier reference voltage constant independent of temperature. Specifically, the plate driving voltage Vpl is kept at a high voltage when the temperature is low, and at a low voltage when the temperature is high, so that the midpoint of the tails of the signal distributions has a constant voltage. This enables the sense amplifier to operate under a constant reference voltage independent of temperature. As a result, the sense amplifier can have a sufficient sense margin.

A method for establishing the plate driving voltage Vpl dependent on temperature as shown in FIG. 3 will be described.

Assuming that the temperature characteristic of the plate driving voltage Vpl is $-P$ [mV/° C.], Vout" in FIG. 8 has a temperature characteristic of $-Y$ [mV/° C.], given by the following equation:

$$-Y = -P \cdot (Vout''/Vpl) \ [mV/° C.] \quad (24)$$

Further, to impart the temperature characteristic of $-Y$ [mV/° C.] to Vout" in FIG. 8, the following equation must be satisfied:

$$(R3''/R2'') \cdot (k/q) \cdot \ln(I1''/I2'') = (-Y - \Delta VBE/\Delta T)/1000 \quad (25)$$

Accordingly, the following equations are established:

$$(R3''/R2'') \cdot \ln(I1''/I2'') = (R3''/R2'') \cdot \ln(Area1''/Area2'') \quad (26)$$
$$= (q/k) \cdot (-\Delta VBE/\Delta T - Y)/1000$$

where Area1" and Area2" represent the sizes of the diodes D1" and D2".

The following equations are finally obtained:

$$R3'' = (I1''/I2'') \cdot R1'' = (Area1''/Area2'') \cdot R1'' \quad (27)$$

$$R2'' = R3'' \cdot (k/q) \cdot \ln(Area1''/Area2'')/\{(-Y - \Delta VBE/\Delta T)/1000\} \quad (28)$$

In accordance with the above-described procedure, R3" is determined at first on the basis of the area ratio between the diodes D1" and D2", and then R2" is determined using a temperature coefficient. R1" is determined on the basis of the maximum power consumption of the circuit shown in FIG. 8.

As described above, in the second embodiment, a sufficient sense margin can be always secured irrespective of temperature by making the plate line driving voltage depend on temperature.

Referring then to FIGS. 14–17, a description will be given of the reason why only the "1" signal distribution at a low temperature has a tail. The energy of a ferroelectric is expressed by a function concerning polarization Pr. In general, it is approximately expressed by quartic or lower-order function. Actually, however, it is possible that the energy is expressed by an even higher-order term such as sextic or eighth-order function.

$$F(Pr) = A + B \cdot Pr^2 + C \cdot Pr^4 + D \cdot Pr^6 + E \cdot Pr^8 \quad (29)$$

Figure 14:
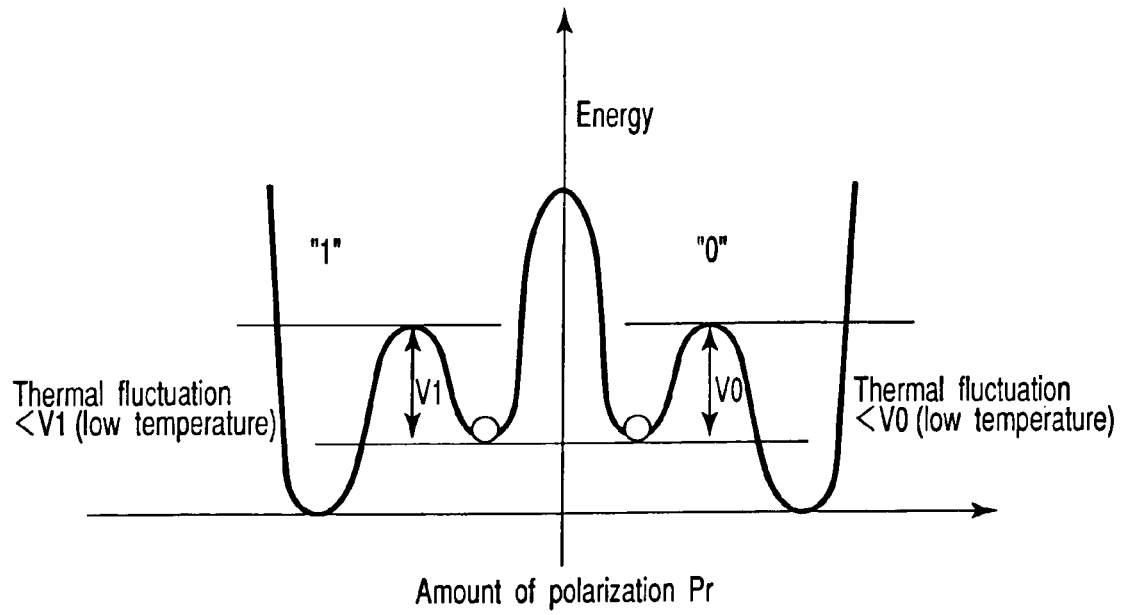
FIG. 14 is a graph showing the energy curve assumed when no voltage is applied between the counter electrodes of a ferroelectric capacitor at a low temperature, if the energy of the capacitor is approximately expressed by the eighth-order function of the amount of polarization.

FIG. 14 shows a case where the energy of the ferroelectric is expressed by the eighth-order function of Pr in the equation (29), and shows a low temperature state. As shown, shallow valley, which indicate quasi-stable states, exist inside the deepest valley that indicate stable states. Since the temperature is low and hence the thermal fluctuation is small, polarization cannot be shifted from a quasi-stable state to a stable state over a potential barrier, and are maintained unchanged. As a result, many polarization of a quasi-stable state exist (the range of variations in polarization is large).

Figure 15:
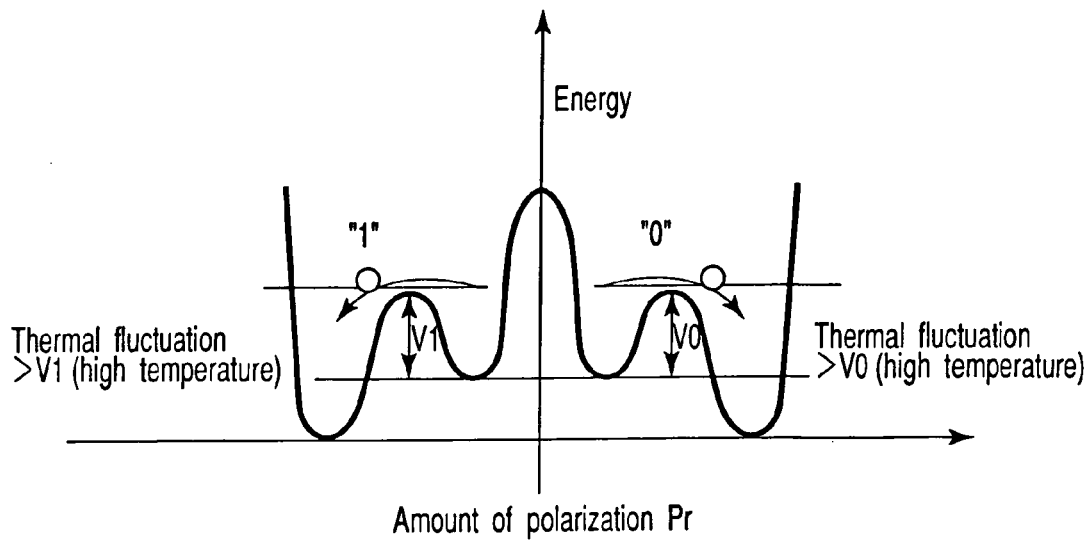
FIG. 15 is a graph showing the energy curve assumed when no voltage is applied between the counter electrodes of a ferroelectric capacitor at a high temperature, if the energy of the capacitor is approximately expressed by the eighth-order function of the amount of polarization.

On the other hand, FIG. 15 shows a case where the energy of the ferroelectric is expressed by the eighth-order function of Pr in the equation (29), and shows a high temperature state. In the state of FIG. 15, the thermal fluctuation is large and the potential barrier is low, and therefore the polarization can be shifted from a quasi-stable state to a stable state. This means that the states of the polarization converge on a single stable state (the range of variation in polarization is small).

Figure 16:
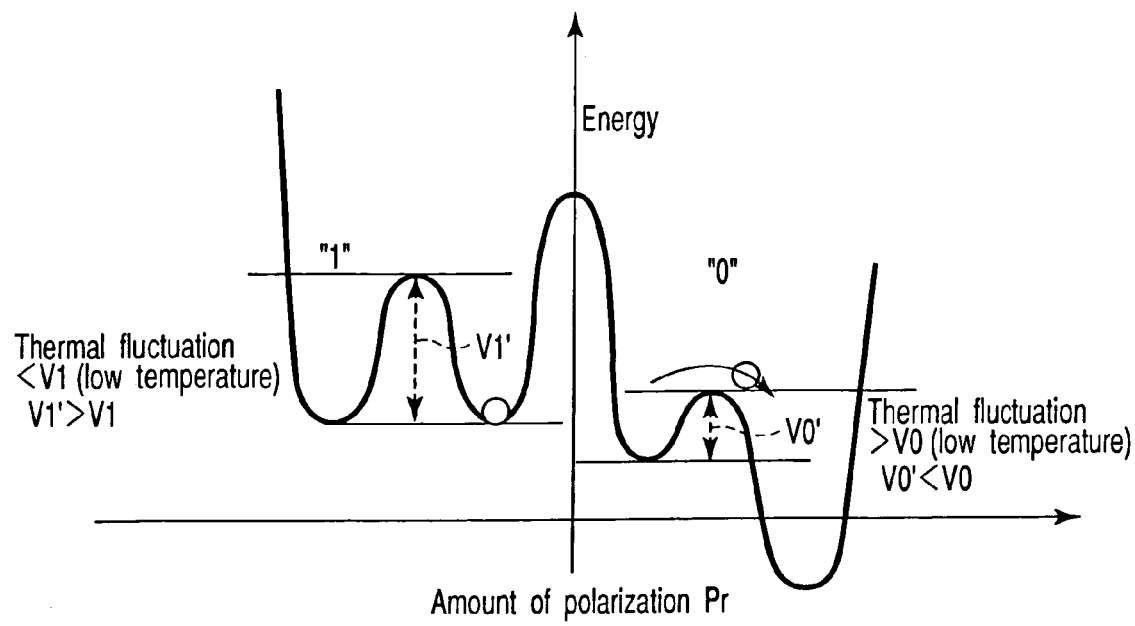
FIG. 16 is a graph showing the energy curve assumed when a low voltage is applied between the counter electrodes of a ferroelectric capacitor at a low temperature.
Figure 17:
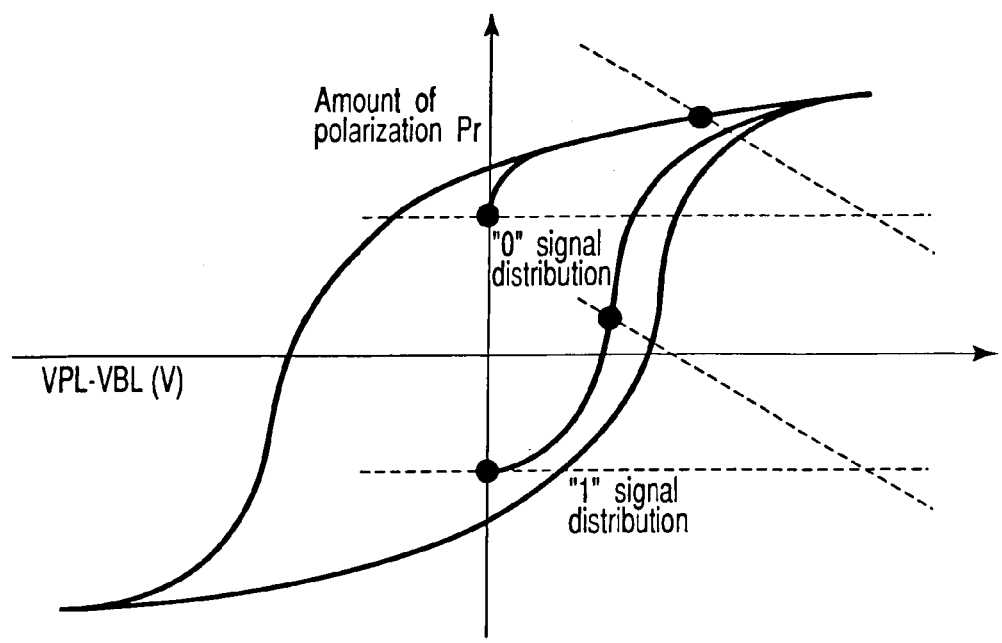
FIG. 17 is a graph illustrating a hysteresis curve assumed in the case of FIG. 16.

FIG. 16 shows an energy curve obtained when the temperature is low, and a low voltage is applied to the ferroelectric capacitor. In this case, in the "0" signal distribution, the quasi-stable state instantly shifts to a stable state since the potential barrier therebetween becomes lower. On the other hand, in the "1" signal distribution, the potential barrier becomes higher, and hence it is considered that transition from a quasi-stable state to a stable state does not easily occur and hence the polarization does not easily converge on a deeper trough. This means that fluctuation of polarization remains. FIG. 17 shows the result of operation point analysis obtained using a hysteresis curve corresponding to FIG. 16. As is understood from FIG. 17, in the "1" signal distribution, the transition occurs in a state in which fluctuation of polarization remains, and therefore the bit line voltage fluctuates.

As described above, in the conventional semiconductor memory, the peak-to-peak midpoint of "0" "1" signal distributions at a low temperature has a higher value than that of "0" "1" signal distributions at a high temperature. In light of this, in the semiconductor memory of the invention, the reference voltage for each sense amplifier, used when data is read from each ferroelectric capacitor to a corresponding bit line, is made higher as the temperature rises. Further, in order to make the midpoint of the window defined between the tails of the "0" "1" signal distributions at a low temperature identical to that of "0" "1" signal distributions at a high temperature, the plate driving voltage for each plate line is made lower as the temperature rises. As a result, a sufficient sense margin can be secured for the sense amplifiers, irrespective of temperature.

The above-described embodiments include inventions of various stages, and the inventions of various stages can be extracted by appropriately combining the structural elements disclosed in the embodiments.

As described above, the invention can provide a semiconductor memory with a ferroelectric memory that has a sufficient sense margin that is unaffected by temperature.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising:
    a memory cell array having a plurality of memory cells;
    a first bit line connected to the memory cells and applied with a voltage read from each of the memory cells;
    a second bit line complementary to the first bit line, the second bit line being supplied with a first reference voltage;
    a sense amplifier which compares the voltage, read to the first bit line, with the first reference voltage supplied to the second bit line, and amplifies the difference between the voltage and the first reference voltage; and
    a plate line connected to the memory cells and supplied with a plate line voltage; and
    a plate line voltage generating circuit which generates the plate the plate line voltage generating circuit being supplied with a second reference voltage having temperature dependence, the plate line voltage generating circuit controlling the plate line voltage by using the second reference voltage having temperature dependence line voltage supplied to the plate line, such that a midpoint of trails of a signal value distribution indicative of "0" data and a signal value distribution indicative "1" data does not have temperature dependence.

2. A semiconductor device according to claim 1, wherein each of the memory cells includes a ferroelectric capacitor and a MOS transistor.

3. A semiconductor device according to claim 2, wherein opposite electrodes of the ferroelectric capacitor are connected to a source of the MOS transistor and a plate line, respectively, a gate of the MOS transistor is connected to a word line, and a drain of the MOS transistor is connected to the first bit line.

4. A semiconductor device according to claim 3, wherein the plate line voltage generating circuit has a voltage generating circuit which generates the second reference voltage having a temperature dependence characteristic Y, the voltage generating circuit including an operational amplifier, first and second diodes and first, second and third resistors, a positive input terminal of the operational amplifier being connected to a ground potential via the second resistor and the second diode connected in series, the positive input terminal also being connected to an output terminal of the operational amplifier via the third resistor, a negative input terminal of the operational amplifier being connected to the ground potential via the first diode, the negative input terminal also being connected to a junction of the output terminal of the operational amplifier and the third resistor via the first resistor, the temperature dependence characteristic Y being imparted to the second reference voltage by determining a resistance R1" of the first resistor on the basis of the maximum power consumption of the voltage generating circuit, a resistor R3" of the third resistor being determined on the basis of the resistor R1", using the following equation (C), a resistor R2" of the second resistor being determined on the basis of the temperature dependence characteristic Y of the second reference voltage and the resistor R3", using the following equation (D), $$R3''=(\text{Area1''}/\text{Area2''}) \cdot R1'' \quad (C)$$

$$R2''=R3'' \cdot k/q \cdot \ln(\text{Area1''}/\text{Area2''})/\{(-Y-\Delta VBE/\Delta T)/1000\} \quad (D)$$

where Area1" and Area2" represent sizes of the first and second diodes, respectively, k =1.38×10$^{-23}$ J/K, q =1.602× 10$^{-19}$ C, and ($\Delta VBE/\Delta T$)≈−2mV/K, −2mV/K being a generally known value.

5. A semiconductor device according to claim 2, wherein the memory cell array is formed by connecting the memory cells in series, in each of which opposite electrodes of the ferroelectric capacitor are connected to a source and drain of the MOS transistor, respectively, and a gate of the MOS transistor is connected to a word line, a plate line being connected to one end of the memory cells connected in series, and the first bit line being connected to another end of the memory cells via another MOS transistor for block selection.

6. A semiconductor device according to claim 5, wherein the plate line voltage generating circuit has a voltage generating circuit which generates the second reference voltage having a temperature dependence characteristic Y, the voltage generating circuit including an operational amplifier, first and second diodes and first, second and third resistors, a positive input terminal of the operational amplifier being connected to a ground potential via the second resistor and the second diode connected in series, the positive input terminal also being connected to an output terminal of the operational amplifier via the third resistor, a negative input terminal of the operational amplifier being connected to the ground potential via the first diode, the negative input terminal also being connected to a junction of the output terminal of the operational amplifier and the third resistor via the first resistor, the temperature dependence characteristic Y being imparted to the second reference voltage by determining a resistance R1" of the first resistor on the basis of the maximum power consumption of the voltage generating circuit, a resistor R3" of the third resistor being determined on the basis of the resistor R1", using the following equation (C), a resistor R2" of the second resistor being determined on the basis of the temperature dependence characteristic Y of the second reference voltage and the resistor R3", using the following equation (D), $$R3''=(\text{Area1''}/\text{Area2''}) \cdot R1'' \quad (C)$$

$$R2''=R3'' \cdot k/q \cdot \ln(\text{Area1''}/\text{Area2''})/\{(-Y-\Delta VBE/\Delta T)/1000\} \quad (D)$$

where Area1" and Area2" represent sizes of the first and second diodes, respectively, k =1.38×10$^{-23}$ J/K, q =1.602× 10$^{-19}$ C, and ($\Delta VBE/\Delta T$)≈−2mV/K, −2mV/K being a generally known value.

7. A semiconductor device according to claim 1, further comprising a reference voltage generating circuit which generates the first reference voltage supplied to the second bit line, the first reference voltage generated by the reference voltage generating circuit being constant and independent of temperature, when data is read from each memory cell.

8. A semiconductor device according to claim 1, wherein the plate line voltage generated by the plate line voltage generating circuit has temperature dependence in which the plate line voltage decreases as temperature increases.

9. A semiconductor device according to claim 1, wherein the plate line voltage generating circuit has a voltage generating circuit which generates the second reference voltage having a temperature dependence characteristic Y, the voltage generating circuit including an operational amplifier, first and second diodes and first, second and third resistors, a positive input terminal of the operational amplifier being connected to a ground potential via the second resistor and the second diode connected in series, the positive input terminal also being connected to an output terminal of the operational amplifier via the third resistor, a negative input terminal of the operational amplifier being connected to the ground potential via the first diode, the negative input terminal also being connected to a junction of the output terminal of the operational amplifier and the third resistor via the first resistor, the temperature dependence characteristic Y being imparted to the second reference voltage by determining a resistance R1" of the first resistor on the basis of the maximum power consumption of the voltage generating circuit, a resistor R3" of the third resistor being determined on the basis of the resistor R1", using the following equation (C), a resistor R2" of the second resistor being determined on the basis of the temperature dependence characteristic Y of the second reference voltage and the resistor R3", using the following equation (D), $$R3''=(\text{Area}1''/\text{Area}2'')\cdot R1'' \quad (C)$$

$$R2''=R3''\cdot k/q\ln(\text{Area}1''/\text{Area}2'')/\{(-Y-\Delta VBE/\Delta T)/1000\} \quad (D)$$

where Area1" and Area2" represent sizes of the first and second diodes, respectively, $k = 1.38 \times 10^{-23}$ J/K, $q = 1.602 \times 10^{-19}$ C, and $(\Delta VBE/\Delta T) \approx -2$mV/K, $-2$mV/K being a generally known value.

* * * * *